United States Patent [19]

Nieto, Jr.

[11] 4,418,314

[45] Nov. 29, 1983

[54] HIGH IMPEDANCE FAST VOLTAGE PROBE

[75] Inventor: Alfonso Nieto, Jr., Yorba Linda, Calif.

[73] Assignee: The United States of America as represented by the Secretary of the Army, Washington, D.C.

[21] Appl. No.: 198,557

[22] Filed: Oct. 20, 1980

[51] Int. Cl.$^3$ ............................................. G01R 31/02
[52] U.S. Cl. .................................. 324/72.5; 324/149; 324/158 P
[58] Field of Search .................... 324/72.5, 149, 158 P

[56] References Cited

U.S. PATENT DOCUMENTS

| | | | |
|---|---|---|---|
| 2,883,619 | 4/1959 | Kobbe et al. | 324/149 |
| 3,532,982 | 10/1970 | Zeidlhack | 324/72.5 |
| 4,051,432 | 9/1977 | Sarjeant | 324/72.5 |

OTHER PUBLICATIONS

Stover et al., "Mamosecond Pulsers for MM Wave Tubes", Research and Development Technical Report DELET-TR-78-2991-3, Feb. 1980, Prepared for U.S. Army Electronics Technology and Devices Labs., Fort Monmouth, N.J. 07703.
C. P. Meadows, "An hf Probe for an Oscilloscope", Radio Communication, vol. 56, No. 12, Dec. 1980, pp. 1284 and 1285.
W. J. Sarjeant et al., "High-Voltage Probe System with Subnanosecond Rise Time", Rev. Sci. Inst., vol. 47, No. 10, pp. 1283-1287, (Oct. 1976).

Primary Examiner—Michael J. Tokar
Attorney, Agent, or Firm—Robert P. Gibson; Jeremiah G. Murray; John W. Redman

[57] ABSTRACT

A fast risetime, high voltage, high impedance voltage probe utilizes a parallel R-C divider with damping and compensation circuitry to allow measurement of voltage from DC to picosecond pulses. A unique feature of this probe is its construction. The performance of this device is made possible by utilizing microwave chip components on a planar circuit used as the center conductor of a coaxial transmission line.

3 Claims, 4 Drawing Figures

HIGH IMPEDANCE FAST VOLTAGE PROBE

The invention described herein may be manufactured and used by or for the Government for governmental purposes without the payment of any royalties thereon or therefor.

BACKGROUND OF THE INVENTION

This invention relates to a fast risetime, high voltage, high impedance probe, for use in the measurement of voltages, in particular as an interface with high impedance oscilloscope inputs.

Numerous applications of subnanosecond high voltage generators require a reliable voltage measurement system. Attenuator probes which are used in conjunction with oscilloscopes have been developed and are suitable for measuring pulse amplitudes. Examples are those covered by Kobbe et al U.S. Pat. No. 2,883,619 and Sargeant U.S. Pat. No. 4,051,432.

SUMMARY OF THE INVENTION

The object of the invention is to fill a previously unfilled requirement for a picosecond high voltage probe which has wide bandwidth, high input impedance, and interfaces with high impedance oscilloscope inputs.

The device, according to the invention utilizes a parallel R-C divider with damping and compensation circuitry to allow measurement of voltage from DC to picosecond pulses. A unique feature of this probe is its construction. The performance of this device is made possible by utilizing microwave chip components on a planar circuit used as the center conductor of a coaxial transmission line.

This probe can be used to extend the capability of real time and sampling oscilloscopes when a high impedance probe is important. The probe's construction technique allows wide adaptability to measuring systems and measurement requirements. No known design has this probe's specifications or construction techniques. Measurements possible with this probe were previously not known to be possible.

DETAILED DESCRIPTION

A description of the probe and its use appears in a research and development technical report #DELET-TR-78-2991-3 "Nanosecond Pulser for MM Wave Tubes" dated February 1980, for the U.S. Army Electronics Research and Development Command under contract no. DAAB07-78-C-2991. A copy of the report is enclosed herewith and incorporated herein by reference.

Figure 1:
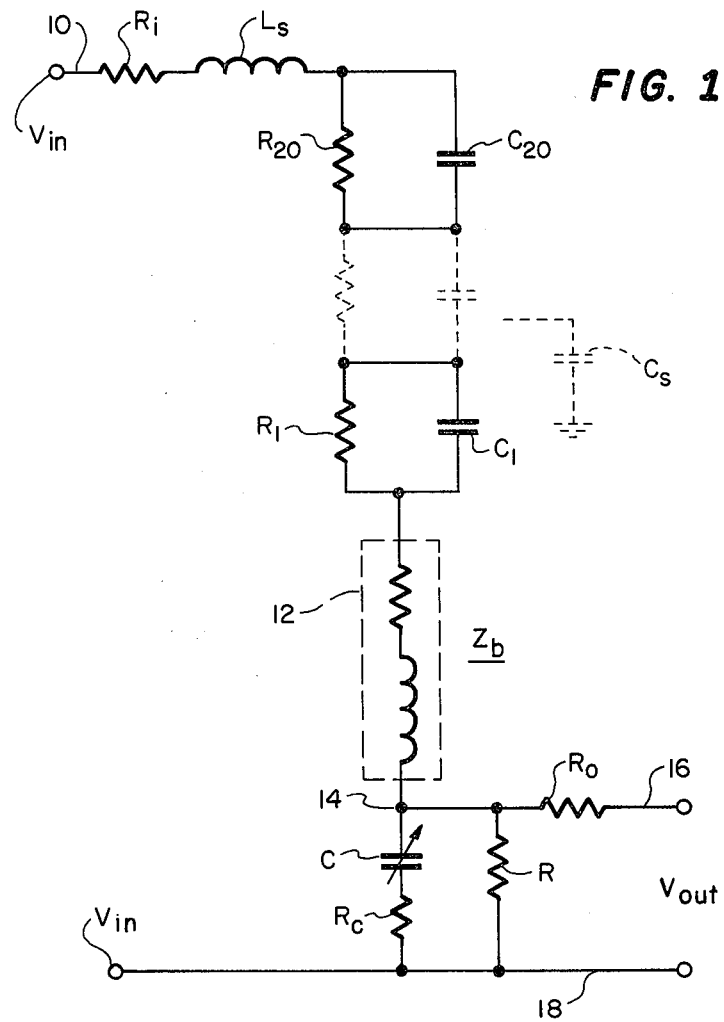
FIG. 1 is a schematic diagram of the probe.

In order to minimize component electrical parasitics, and maintain high self resonant frequencies, microwave chip components were selected for circuit elements. These comprise twenty resistors R1-R20 in series, and twenty capacitors C1-C20 in series, with each resistor connected in parallel with a corresponding capacitor. The resistors R1-R20 are Mini Systems Inc. Type WA-24, 1% tolearance of value 33K ohms; and the capacitors C1-C20 are American Technical ceramics type 100B-300-F-P-X-500 porcelain, of value 30 picofarads. An input resistor Ri is connected in series between the probe tip wire 10 and the resistor R20-capacitor C20 combination. Two Phillips type 4B ferrite beads 12 are connected from the combination of resistor R1 and capacitor C1 to a junction 14. The ferrite beads are represented in FIG. 1 as an impedance Zb comprising a resistance and inductance in series. An output resistor Ro is connected from the junction 14 to the lead 16 to the center of the output connector. A resistor R is connected from the terminal 14 to a ground strap 18. A variable capacitor C in series with a resistor Rc is connected between the terminal 14 and the ground strap 18. FIG. 1 also shows series stray inductance Ls, and shunt stray capacitance Cs, required for accurate equivalent circuit representation.

Figure 2:
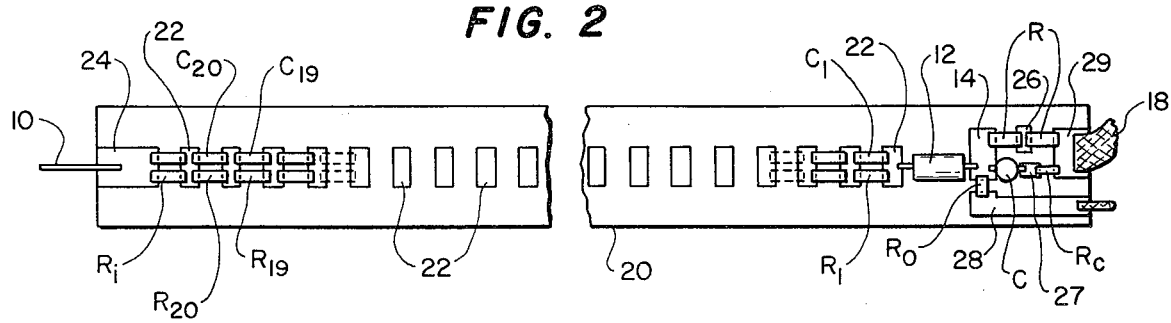
FIG. 2 is a plan view of the circuit board layout and parts location.

The circuit board layout and parts location is shown in FIG. 2. A side view of the circuit board appears in the assembly drawing of FIG. 3. To minimize stray capacitance effects, a low relative dielectric circuit board 20, of teflon fiberglass is used, which is etched copper clad. The circuit was designed to present an approximately uniform longitudinal strip cross section, which combined with the constant inner diameter of the outer copper tube conductor 30 controls the stray inductance Ls and stray capacitance Cs shown in FIG. 1.

Figure 3:
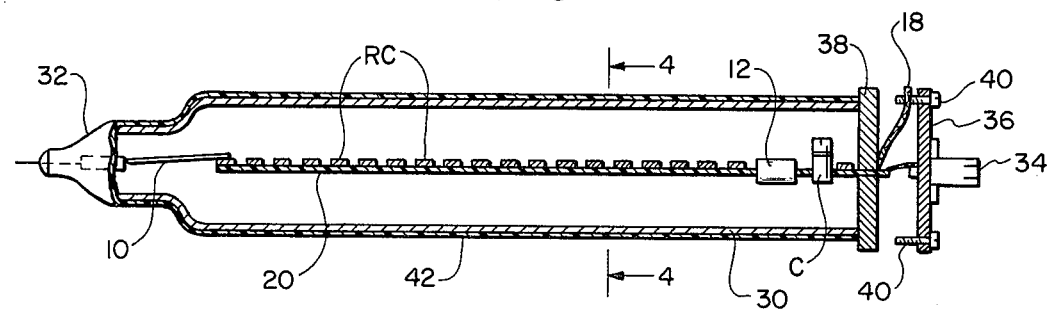
FIG. 3 is a view, partly in section, of the mechanical assembly of the probe.
Figure 4:
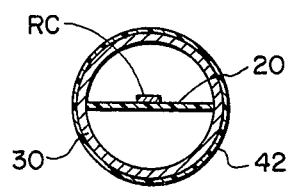
FIG. 4 is a cross section view along lines 4—4 of FIG. 3.

The assembly is shown in FIG. 3, with the circuit board and output connector slightly moved from its assembled position in the outer tube.

The resistors R1-R20 and capacitors C1-C20 are mounted between etched copper pads 22. Only some of these resistors and capacitors are shown in FIG. 2. FIG. 3 shows only composite profiles of the resistors and capacitors. The input resistor Ri is mounted between one of the pads 22 and an end pad 24. A stainless steel wire 10, used as the probe tip wire, is soldered to pad 24 at the circuit input. A larger pad forms the junction 14. Other pads 26-29 are provided to mount the components R, C, Rc, and Ro.

The effect on the circuit of the relatively large ferrite beads 12, and the variable capacitor C, is minimized by partially imbedding them below the plane of the circuit board. A Tektronix miniature probe tip adapter 32 was found convenient to adapt the probe tip wire 10 and outer conductor tube 30 to a useful form. The circuit output is coupled out through the center conductor of a Tektronix miniature test point jack 34. This was a matter of convenience and not critical to probe performance. The circuit return path connection is made by a copper strap 18 soldered to the circuit board and clamped between the output connector flange 36 and the flange 38 of the outer conductor tube 30. Four screws 40 secure these two flanges. An insulating sleeve 42 is fitted over the outer conductor to prevent accidental test circuit contact.

The electrical performance of this probe is controlled in four stages according to the requency of excitation. This is explained in terms of time from excitation by a picosecond risetime step waveform.

During the picosecond time frame, when frequency components of several gigahertz are prevalent, the chip resistors act more like small capacitors, and the capacitors' reactances become small. The overall circuit attenuation is controlled by the loss and characteristic impedance of the coaxial line. Sufficient attenuation is achieved through loading of the line with ferrite beads. These beads present a significant real impedance to high frequency signals. The circuit location of the beads is important in supressing spurious oscillations.

In the nanosecond time region, resistors Ro, Rc, and Ri become more significant. They, combined with the ferrite beads 12, provide the necessry attenuation and reflection damping.

Microsecond signal attenuation derived from the capacitive divider is formed by capacitors C1 thru C20, and the variable capacitor C at the output. The variable capacitor C allows periodic recalibration for a flat response transisition from pulse risetime to an essentially DC condition.

As the time goes from milliseconds to seconds, the atenuation control shifts from the capacitive divider to a resistive divider made of resistors R1 thru R20 and resister R at the output Circuit physical design has proven to be as important as component values in providing for a smooth response transition between the pico, nano, and microsecond time frames. This is due to critical damping requirements on mismatch reflections and spurious oscillations.

Test Results

Initial tests revealed the following:
DC Input Impedance: 660K ohms
Maximum Dissipation: 6 Watts
Attenuation Ratio: 10:1
Maximum Input Voltage: 2 kV
Risetime (Probe alone): Less than 100 ps
Linearity Deviation: Less than 20% for the first 2ns and less than 10% thereafter In one exemplary embodiment of the probe, the circuit board 20 has dimensions of 4.80 inches long, 0.50 inches wide and 0.062 inches thick.

The dimensions of the pads 22 are 0.075 inches by 0.150 inches, and the spacing between them is 0.100 inch. The inner diameter of the outer conductor tube 30 is 0.525 inch.

The resistors R1–R20 are 33 kiloms, Mini Systems Inc. type WA-24, 1%. The capacitors C1–C20 are 30 picofarad, type ATC 100B-300-F-P-X-500. The resistor Ri 165 ohms (two 330-ohms in parallel) Varadyne 3C 331F. Resistor Ro is 120 ohms, Varadyne 1C 121F. Resistor Rc is 330 ohms, MSI WA-4, 1%. Resistor R comprises 33K+47K in series, MSI WA-24, 1%. The variable capacitor C is 0.6-4.5 picofarads, ATC type MTR 504.

The exact values of the resistors Ri, Ro, Rc and capacitor C can vary significantly depending on the accuracy of the physical dimensioning of the probe. It will usually be required to experimentally determine the values required to experimentally determine the values required to achieve optimum probe electrical performance.

The component values themselves are not the crux of this invention. Large variations of probe impedance are possible by varying the resistor R and R1–R20 and capacitor C1–C20 values and then necessarily determining the new values of components Ri, Ro, Rc and C for optimum performance. Any change in parameters may require changes in probe physical dimensions. The construction techniques, types of components, and relationship of these to dimensioning are the necessary elements of the invention.

The developement of an alternative embodiment which interfaces with 50-ohm oxcilloscope inputs has been begun. It utilizes the same construction techniques as the embodiment described above except that element values are changed and the output resistance is the 50-ohm input impedance of the oscilloscope. Significant changes in dimensions and element values will be required, but the proven techniques of the above embodiment will be utilized. However, the new probe will be within the scope of the invention.

I claim:

1. A probe comprising a cylindrical outer conductor, a circuit board mounted within said outer conductor, said circuit board being of a material having a low relative dielectric constant which is metal clad etched to provide pads for mounting components and making connections, several chip resistors in series mounted longitudinally along the center of said circuit board, several chip capacitors also mounted longitudinally along the center of said circuit board with each said chip capacitor connected in parallel with one of said chip resistors, an input probe conductor connected to one end of said circuit board, an input resistor mounted on the circuit board in series between the input probe conductor and said chip resistors and chip capacitors, ferrite bead means connected in series with the chip resistors and chip capacitors along the center of the circuit board to a junction, output means having a center conductor and a ground conductor, an output resistor connected between said junction and the center conductor of the output means, a variable capacitor in series with a resistor connected between said junction and the ground conductor, and a shunt resistor connected between said junction and the ground conductor.

2. A probe according to claim 1, wherein said ferrite bead means and said variable capacitor are partially imbedded below the plane of the circuit board to minimize the effect on the circuit.

3. A probe according to claim 1 or 2, wherein said circuit board is of teflon fiberglass, said metal clad being copper, and said input probe conductor is a stainless steel wire.

* * * * *